US 6,716,766 B2

(12) United States Patent
Ko (10) Patent No.: US 6,716,766 B2
(45) Date of Patent: Apr. 6, 2004

(54) PROCESS VARIATION RESISTANT SELF ALIGNED CONTACT ETCH

(75) Inventor: Kei-Yu Ko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 10/226,488

(22) Filed: Aug. 22, 2002

(65) Prior Publication Data

US 2004/0038546 A1 Feb. 26, 2004

(51) Int. Cl.⁷ ...................... H01L 21/302; H01L 21/461
(52) U.S. Cl. ......................... 438/734; 438/710
(58) Field of Search .............................. 438/710, 695, 438/706, 700, 701, 707, 713, 714, 734

(56) References Cited

U.S. PATENT DOCUMENTS

| | | | | |
|---|---|---|---|---|
| 5,817,579 A | * | 10/1998 | Ko et al. .................... | 438/740 |
| 5,948,701 A | | 9/1999 | Chooi et al. ................ | 438/694 |
| 6,028,001 A | * | 2/2000 | Shin ............................ | 438/640 |
| 6,191,042 B1 | * | 2/2001 | Tsai et al. ................... | 438/700 |
| 6,326,312 B1 | * | 12/2001 | Kim ............................ | 438/696 |
| 6,337,285 B1 | | 1/2002 | Ko .............................. | 438/714 |
| 6,372,634 B1 | * | 4/2002 | Qiao et al. .................. | 438/637 |

* cited by examiner

*Primary Examiner*—Michael S. Lebentritt
*Assistant Examiner*—Beth E. Owens
(74) *Attorney, Agent, or Firm*—Dorsey & Whitney LLP

(57) ABSTRACT

A method for forming an opening through an interlayer to expose an underlying surface that retains high etch selectivity while having a relatively large process window to accommodate process variations. The method etches an interlayer under a first etching condition that forms a protective layer over portions of exposed surfaces of the opening during the etch process. The formation of the protective layer continues until an etch stop condition is produced, stopping further etching of the interlayer under the first condition prior to exposing the underlying surface. The method continues with etching through the protective layer under a second etching condition to expose a residual interlayer, and etching the exposed residual interlayer under the second etching condition to expose the underlying surface.

92 Claims, 4 Drawing Sheets

PROCESS VARIATION RESISTANT SELF ALIGNED CONTACT ETCH

TECHNICAL FIELD

The present invention relates to a method for etching contacts through layers of an integrated circuit and, in particular, to a self aligned contact (SAC) etch using a multi-step process.

BACKGROUND OF THE INVENTION

The current semiconductor industry poses an ever-increasing pressure for achieving higher device density within a given die area. This is particularly true in memory circuit fabrication, for example, in the manufacture of dynamic random access memory (DRAM). Each memory cell of a DRAM typically consists of a single capacitor and a field effect transistor (FET), which is used as a charge transfer transistor. Binary data is stored as electrical charge on the capacitor in the individual memory cells. In recent years, the number and density of these memory cells on the DRAM chip has dramatically increased so that the number of memory cells on a single chip is expected to soon reach 1 Gigabit.

The increase in circuit density is the result of scaling the individual semiconductor devices (e.g., FETs and capacitors) and increasing device packing density. The reduction in device size is due partly to the advances in photolithography and directional (anisotropic) plasma etching. The increase in device density, however, places increasing demands on many aspects of the fabrication process. For example, alignment of features from one level to the next is of critical importance, particularly the alignment of contact holes with underlying structures, such as an active area, with which they are to connect. The miniaturization of the devices makes the formation of interconnect structures difficult because maintaining sufficient electrical communication requires that the interconnect structure is formed in exact alignment with an underlying active region. At the same time, the area of the interconnect structure interfacing with the active area must be maximized. Thus, as device sizes shrink there is less room for misalignment errors of the interconnect structure.

Figure 1:
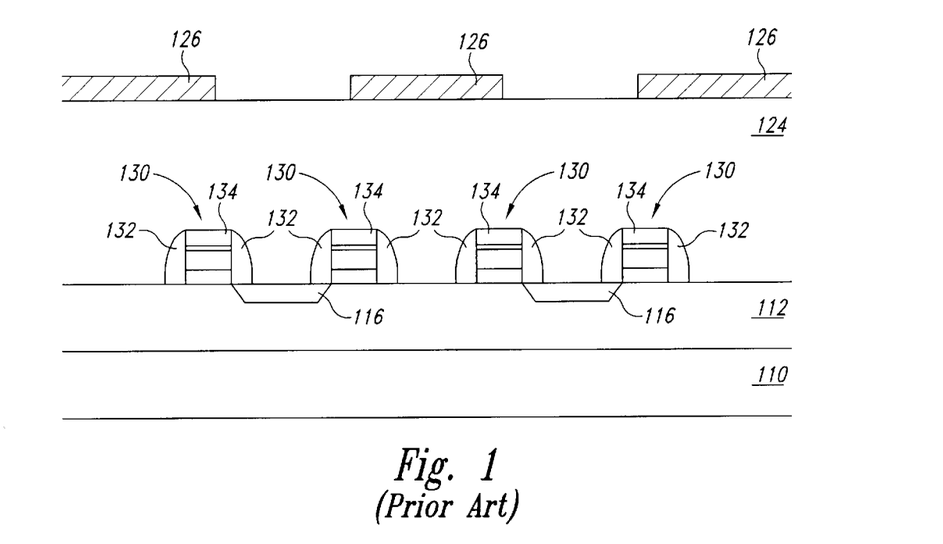
FIG. 1 is a simplified cross-sectional view of a portion of a conventional memory device prior to formation of a self-aligned contact.

As the horizontal device feature sizes continue to shrink to submicrometer dimensions, it is necessary to use self-alignment techniques to relax the alignment requirements and improve critical dimension (CD) control. One such technique is called a self-aligned contact (SAC) etch, in which a pair of adjacent gates of the FETs of a pair of memory cells are utilized to align an etched opening in an insulating layer. FIG. 1 depicts a conventional memory cell construction for a DRAM at an intermediate stage of the fabrication. A pair of memory cells having respective access transistors are formed within a substrate. N-type active regions 116 are provided in a doped p-type well 112 of substrate 110 (for NMOS transistors) and the pair of access transistors have respective gate stacks 130. The gate stacks 130 include nitride spacers 132 and nitride caps 134 formed to protect the gate stacks 130 and provide an etch stop layer for the SAC etch. An insulating layer 124 of, for example, a borophosphosilicate glass (BPSG), has been applied over the substrate and transistor structures and a mask layer 126 having openings for etching the insulating layer to form contact openings to active regions 116 are also shown. Theoretically, the mask 126 is properly aligned to enable a SAC etch of the insulating layer 124 to provide contact openings down to the active regions 116.

The SAC etch processes primarily involve dry etches or plasma etches. Almost all of the current dry etch technology for SAC etch processes uses a $C_xF_y$ (x>1)-type plasma chemistry, such as, for example, $C_4F_8$, $C_5F_8$, or $C_4F_6$, in combination with other diluent gases. The $C_xF_y$ type chemistry is favored because it offers very high selectivity to the silicon nitride cap and silicon nitride spacers, which are the most typical etch stop material for gate stack protection in a SAC etch. However, it has the disadvantage that the conventional SAC etch parameters have a very small process window. This is primarily due to the fact that the $C_xF_y$-type chemistry generates a fluorocarbon polymer which is more carbon rich than the polymers generated with other types of chemistry. With this very carbon-rich fluorocarbon polymer, the etch often results in etch stop condition, a situation when etching stops before reaching the substrate, when the gas flow or temperature is off even by a small amount from the optimal setting.

Conventional approaches to this issue generally attempt to minimize the deposition of polymer, while still maintaining the etch selectivity and controlling overetching conditions to ensure completion of the SAC etch. That is, conventional SAC etch processes try to balance etch chemistry and etch conditions to thoroughly etch through the BPSG, but does not etch the silicon nitride spacers 132 and caps 134 of the gate stacks 130, and does not deposit enough polymer to cause an etch stop condition prior to exposing the active region. This has been accomplished by varying the chemistry and process parameters, such as the gas phase chemistry through adjustments in the plasma reactor gases or the operating pressure. However, as previously mentioned, to perform an adequate SAC etch using conventional methods, the process parameters must be maintained within a very narrow range. Therefore, there is a need for an alternative etching process that can maintain selectivity to nitride regions while allowing for variations in process parameters.

SUMMARY OF THE INVENTION

The present invention is directed to a method for forming an opening through an interlayer to expose an underlying surface that retains high etch selectivity while having a relatively large process window to accommodate process variations. The method includes masking an interlayer to define an etching area at which the opening is formed, etching the interlayer under a first etching condition through the etching area, and forming a protective layer over portions of exposed surfaces of the opening during etching under the first etching condition. The formation of the protective layer can be performed by utilizing an over-polymerizing etch condition that promotes the formation of a fluorocarbon polymer layer.

The formation of the protective layer continues until an etch stop condition via polymer pinch-off is produced, shutting off etching of the interlayer under the first condition prior to exposing the underlying surface. The method continues with etching through the protective layer under a second etching condition to expose a residual interlayer, and etching the exposed residual interlayer under the second etching condition to expose the underlying surface. The protective layer deposited prior to etching under the second condition shields any underlying structures, resulting in high etch selectivity during the second etch.

DETAILED DESCRIPTION OF THE INVENTION

Embodiments of the present invention are directed to a self aligned contact (SAC) etch method that retains high etch selectivity while having a large process window to accommodate process variations, for example, variations in process temperature. In the discussion which follows, the invention is described with reference to a plasma etching process for etching through a selected portion of an insulating oxide layer, such as a BPSG layer, in a SAC etch used in the fabrication of memory devices. However, it should be understood that the invention pertains to any applications which require selectivity to an underlying structure during the etch of doped silicon oxide dielectric layers. Additionally, in the following detailed description, reference is made to various specific embodiments in which the invention may be practiced. These embodiments are described with sufficient detail to enable those skilled in the art to practice the invention, and it is to be understood that other embodiments may be employed, and that structural and process changes may be made without departing from the teachings of the invention.

It will be appreciated that the terms "wafer" or "substrate" used in the following description may include any semiconductor-based structure that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions or layers in or on the base semiconductor or foundation.

Additionally, the term "part" is used to indicate one of several equal units of which the gaseous mixtures used in the present invention are comprised. Because all gases are used at identical pressures and temperatures, the term part is used instead of other terminology (e.g., moles) to underscore the importance of using the gases in particular ratios as opposed to in particular amounts.

Embodiments of the present invention include a first over-polymerizing etching step (first etching stage) for etching partially through the oxide layer of the substrate and depositing a layer of fluorocarbon polymer over exposed surfaces of the partially etched opening which results in "pinching-off" the fluorocarbon polymer layer to create an etch stop condition of the first etching step. As the fluorocarbon polymer layer pinches off in the region of the gate stacks, the first etching step stops. The first etching step can employ a first chemistry and a first set of process parameters. For example, the first chemistry can use a $C_xF_y$ (x>1)-type chemistry with a very good selectivity to the silicon nitride cap and silicon nitride spacers of the gate stacks in a SAC structure. The first process parameters include a relatively low power setting (e.g., in the range of 1000–1500 W) and/or high $C_xF_y$ gas flow that maintains high nitride selectivity, but also deposits enough polymer to close off the space between the gate stacks in the SAC structure and cause an etch stop condition. The first etching step is used to etch the insulating oxide layer, for example BPSG layer, to a point which does not reach the top surface of an active region formed in a substrate. It will be appreciated, however, that chemistries and process parameters other than those previously described can be used as well without departing from the scope of the present invention.

A second etching step is employed to etch through the pinched-off polymer layer deposited during the first etching step and etch the remaining oxide layer to expose the top surface of the active region (second etching stage). The second etching step can employ a second chemistry similar to that of the first chemistry, or alternatively, a hydrogen-containing fluorocarbon chemistry. A second set of process parameters includes a higher power setting than for the first set of process parameters. During the second etching step, residual polymer material remaining after the first etching step shields the nitride caps and spacers of the gate stacks while the remaining oxide is etched to expose the top surface of the active region. As a result, the second etching step completes the SAC etch by etching down to the active region without damaging the cap and spacers of the gate stacks, and high selectivity to the nitride cap and spacers protecting the gate stack can be maintained.

Embodiments of the present invention allow for wider variations in process parameters than convention SAC etch processes. For example, as will be described in more detail below, a wider range of process temperatures can be used with the present invention. Thus, where performing a SAC etch at a relatively low temperature (e.g., below 30 degrees Celsius in a capacitively coupled reactor or below 20 degrees Celsius in an inductively coupled reactor) is desired, the present invention can be used. It will be appreciated, however, that embodiments of the present invention include performing a SAC etch at higher temperatures as well, such as temperatures in the range between 30–60 degrees Celsius). It will be further appreciated that the specific temperature values provided herein generally refer to the wafer temperature which may be controlled (e.g., set using the temperature setting control of an electrostatic chuck on which the wafer is positioned during processing). These values are approximate since the actual temperatures will vary depending on the particular machine being used.

Moreover, embodiments of the present invention can be carried out in a high density plasma (HDP) etcher, or alternatively, in a reactive ion etcher (RIE), including magnetic-enhanced reactive ion etcher (MERIE). As is well known, a high density plasma etcher has both a top powered electrode and a bottom electrode, which is typically a biasable electrostatic chuck. Power is applied to both the top and bottom electrodes with separate power supplies. In a reactive ion etcher, the top electrode is typically grounded, and RF power is applied to the bottom electrode. More generally, any oxide etch tool, including those having an "inductively coupled" power source or a "capacitively coupled" power source, or "dual-powered" or "dual frequency" reactors having dual-capacitively coupled power sources, can be used as well. These various types of etch tools are well-known to those of ordinary skill in the art.

An inert gas, such as argon or helium, may be added to the plasma source gas to dilute the etching gases and to enhance the uniformity of the etching process. A preferred diluent gas is argon. It must be understood, however that similar effects may be achieved by using other gases, such as helium, although argon is preferred.

Referring now to the drawings, where like elements are designated by like reference numerals, a representative etching process according to the present invention is illustrated in FIGS. 2–8. These figures show a middle portion of the structure shown in FIG. 1.

Figure 2:
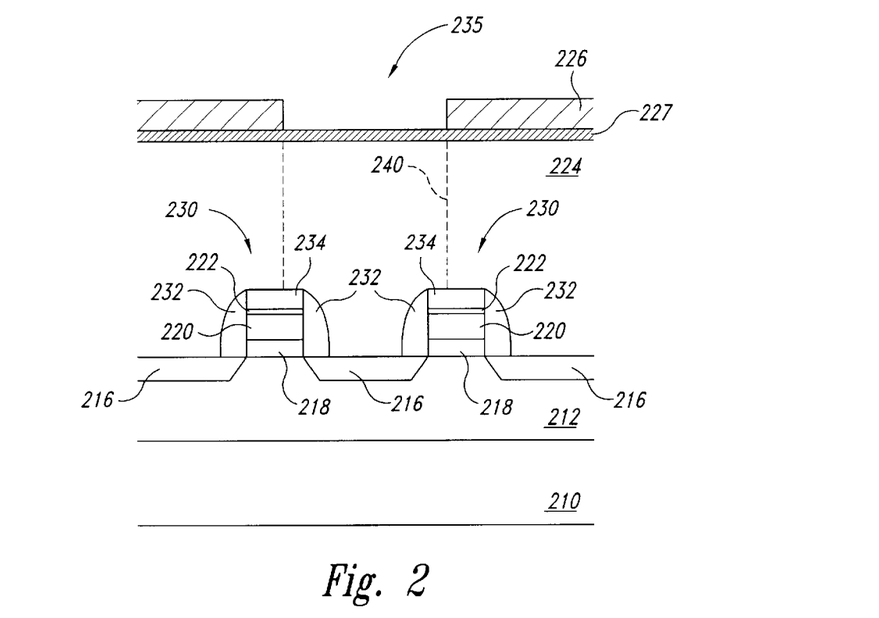
FIG. 2 is a simplified cross-sectional view of a semiconductor substrate that can be processed to form a self-aligned contact in accordance with an embodiment of the present invention.

The structure shown in FIG. 2 includes a substrate 210 having a p-well 212, which is typically doped to a predetermined conductivity, for example, p-type or n-type, depending on whether NMOS or PMOS transistors will be formed therein. The structure includes conventional doped active areas 216, and a pair of gate stacks 230, all formed according to well-know semiconductor processing techniques. The gate stacks 230 include an oxide layer 218, a conductive layer 220, such as polysilicon, nitride spacers 232 and a nitride cap 234. It will be appreciated that an oxide material can be substituted for the nitride material of the nitride spacers and cap 232, 234 without departing from the scope of the present invention. A silicide layer 222 is also typically formed between the conductive layer 220 and nitride cap 234. Refractory metal silicide layer 222 may comprise any refractory metal, including but not limited to, titanium, tungsten, tantalum, and molybdenum. Preferably, the refractory metal salicide layer is substantially composed of tungsten silicide ($WSi_x$). An insulating oxide layer 224, for example a borophosphosilicate glass (BPSG), borosilicate glass (BSG), or phosphosilicate glass (PSG) layer, covers the substrate 210 which contains the gate stacks 230 and active regions 216. Optionally, an antireflecting coating (ARC) 227 is disposed on top of insulating oxide layer 224.

To create a contact opening 240 into semiconductor substrate 210 through oxide layer 224, a photoresist material 226 is deposited and patterned using conventional photolithography steps. An initial opening 235 is created in photoresist layer 226 for subsequent oxide 224 etching. The structure of FIG. 2 is then etched according to a method of the present invention.

Figure 3:
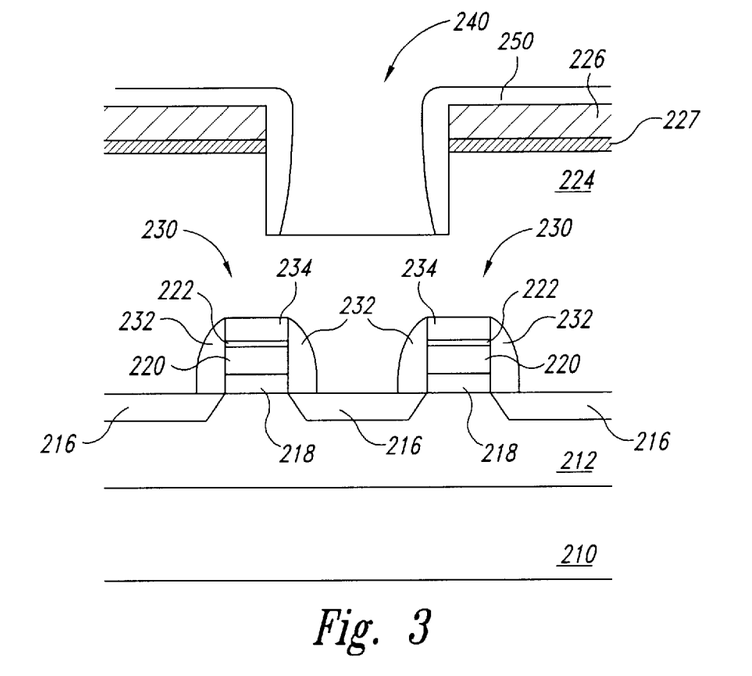
FIG. 3 is a simplified cross-sectional view of the substrate of FIG. 2 at a later point in processing, in accordance with an embodiment of the present invention.

Reference is now made to FIG. 3, which shows the structure of FIG. 2 with the contact opening 240 partially etched therein. The contact opening 240 is etched using a directional etching process such as plasma etching. In the present embodiment, a first $C_xF_y$ (x>1)-type chemistry is used to etch the doped insulating oxide layer 224, with good selectivity to the silicon nitride cap 234 and spacer 232 of the gate stacks 230. However, in alternative embodiments of the present invention, other fluorocarbon gases can be used as well, such as $CF_x$, $C_xH_yF_z$ (x>0), $CHF_3$, $CH_2F_2$, and the like. As previously mentioned, the first set of process parameters includes a relatively low power setting and relatively high gas flow of fluorocarbon gases to induce deposition of a fluorocarbon polymer layer 250 on the exposed regions of the contact opening 240 during the first etching step. The combination of the first chemistry and first set of process parameters results in an over-polymerizing etch condition where the thickness of the deposited polymer layer 250 increases as the first etching step progresses. Examples of appropriate chemistries and process parameters will be provided below.

Figure 4:
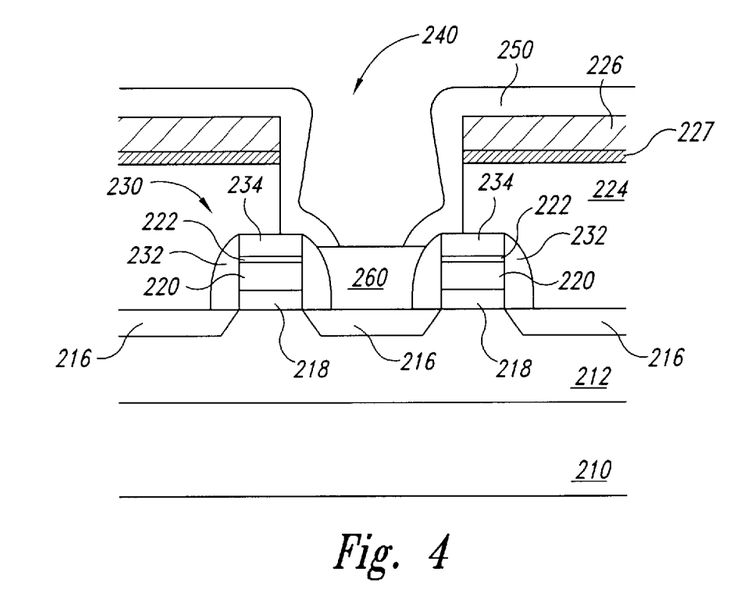
FIG. 4 is a simplified cross-sectional view of the substrate of FIG. 3 at a later point in processing, in accordance with an embodiment of the present invention.
Figure 5:
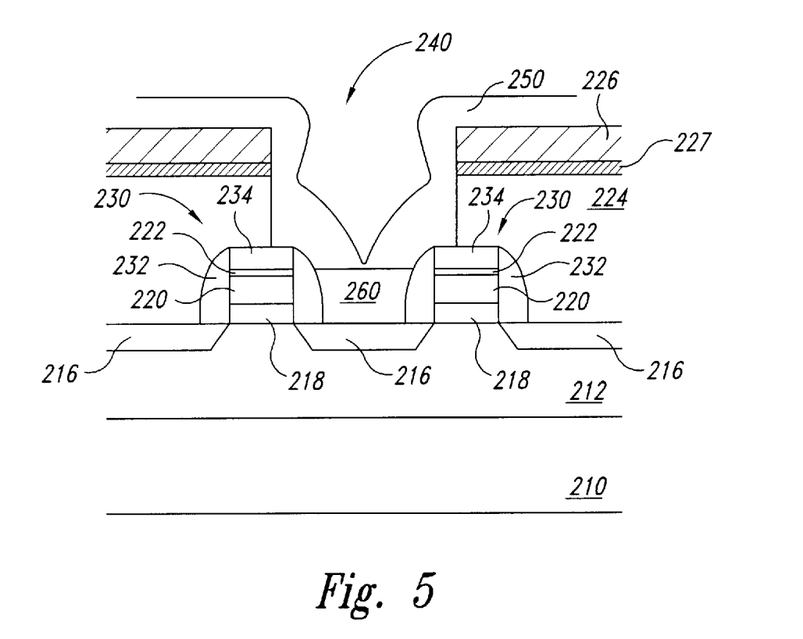
FIG. 5 is a simplified cross-sectional view of the substrate of FIG. 4 at a later point in processing, in accordance with an embodiment of the present invention.

As illustrated in FIG. 4, as the first etching step reaches a depth that begins to expose portions of the nitride cap 234 and spacers 232 of the gate stacks 230, the thickness of the polymer layer 250 in the region of the "shoulders" of the gate stacks 230 begins to increase more rapidly than on the exposed vertical and horizontal surfaces of the opening 240. As the first etching process continues, the thickness of the polymer layer 250 at the shoulder continues to increase, resulting in the step profile as shown in FIGS. 4 and 5. As shown in FIG. 5, the polymer layer 250 eventually becomes thick enough in the region of the shoulders to pinch-off the opening between the gate stacks 230. As a result, an etch stop condition of the first etching step occurs because no more of the oxide layer can be etched, which leaves an unetched portion 260 of the insulating oxide 224 above the active region 216. The phenomena producing the step profile of the polymer layer 250 and resulting etch stop condition are well known in the art, and will not be explained in detail herein for the sake of brevity. It will be appreciated that the specific chemistry and process parameters described herein are merely provided by way of example, and that modifications made to either will not depart from the scope of the present invention.

The plasma etching process uses a first process gas that comprises a mixture of a $C_xF_y$-type (x>1) gas and a dilute gas, such as argon. The $C_xF_y$-type gas can be selected from, but not limited to $C_4F_8$, $C_4F_6$, or $C_5F_8$. For example, the first process gas could be a gas mixture with a flow rate of 18 sccm of $C_4F_8$ and 400 sccm of Ar. However, any other gas flow rate ratio can also be used to achieve different selectivity levels to the silicon nitride cap and spacers, as well as the deposition rate of polymer. Oxygen or CO may also be added to the gas mixture. Other gas such as $CH_2F_2$ may also be added to the $C_xF_y$ gas mixture, however, as known in the art, the nitride selectivity is primarily determined by the $C_xF_y$ (x>1) gas.

The structure can be contacted with the first plasma etch for any time sufficient to cause the deposited polymer layer 250 to pinch-off the opening between the gate stacks 30, which leaves the unetched portion 260 above the active region 216. It should be understood that these times may vary depending upon the substrate, the etching gas, and the physical parameters of the plasma etch. Preferably, the first etching step stops because of the etch stop condition in the range between below the top-of-nitride cap 234 and any distance before the etch reaches the active region 216.

Following the first etching step, a second plasma etch step is performed that etches an opening through the pinched-off polymer layer 250 and removes the unetched portion 260 of the insulating oxide 224, thereby exposing the surface of the active region 216. The second chemistry of the second etching step may be a $C_xF_y$ (x>1)-type chemistry, similar to the first chemistry of the first etching step. Alternatively, a hydrogen-containing fluorocarbon chemistry can be used as well. Where a hydrogen-containing fluorocarbon chemistry is used, the hydrogen-containing fluorocarbon gas is preferably selected from the group $CF_4$, $CHF_3$, $CH_2F_2$, $C_2HF_5$, $CH_3F$, and any combinations thereof. An inert gas, such as argon, nitrogen, or helium, is often used in combination with the gas mixture of the second etching step. For example, an appropriate gas composition is $C_4F_8$, $CH_2F_2$, and Ar, and where a hydrogen-containing fluorocarbon chemistry is desired, $CF_4$, $CHF_3$, $CH_2F_2$, and Ar.

Figure 6:
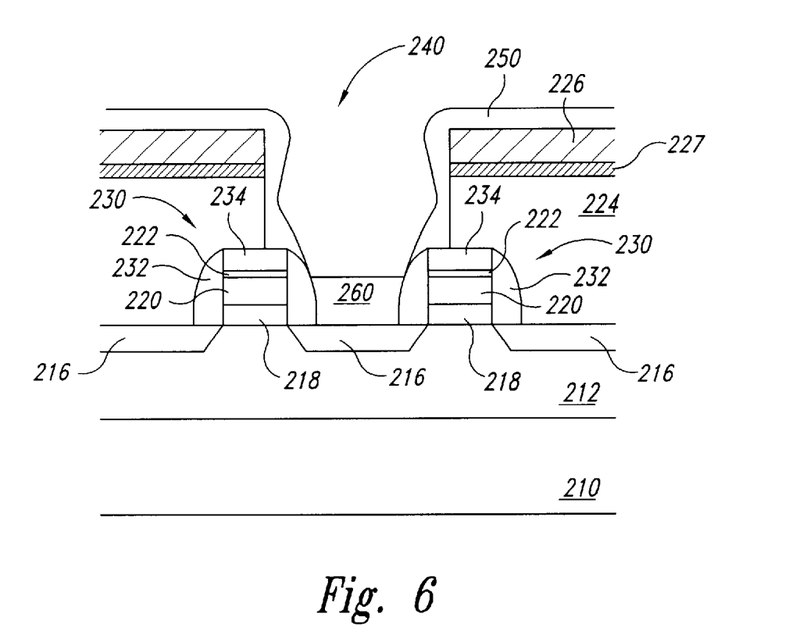
FIG. 6 is a simplified cross-sectional view of the substrate of FIG. 5 at a later point in processing, in accordance with an embodiment of the present invention.
Figure 7:
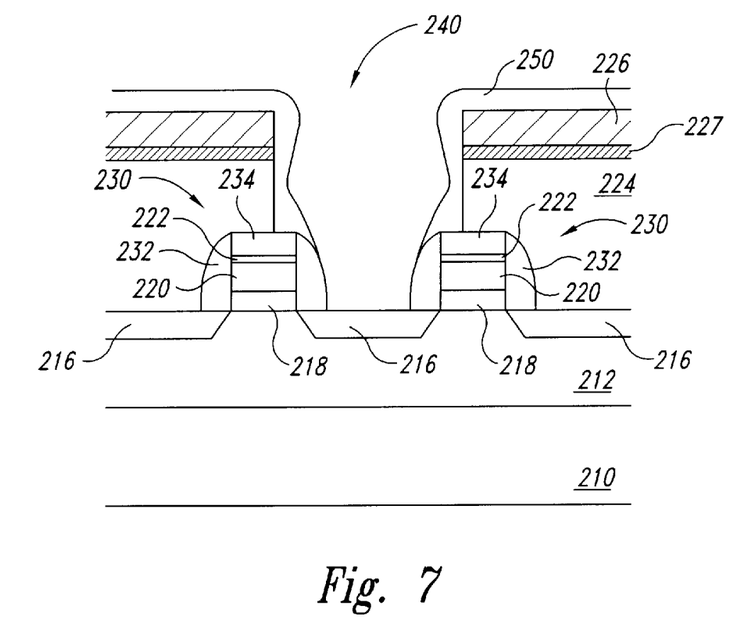
FIG. 7 is a simplified cross-sectional view of the substrate of FIG. 6 at a later point in processing, in accordance with an embodiment of the present invention.

As previously mentioned, if $C_xF_y$ type chemistry is used in the second etching step, the second process parameters includes a relatively high power setting and a relatively low $C_xF_y$ gas flow to etch through polymer layer 250 in the pinched-off region, and continue the removal of unetched portion 260 of the insulating oxide 224, as shown in FIG. 6. The second etching step finishes the contact hole 240 etch in that the doped insulating oxide layer 224 is etched down to the active region 216 without damaging the gate stacks 230 since nitride selectivity to the nitride cap 234 and spacers 232 is maintained by the residual polymer layer 250 covering the nitride cap 234 and spacers 232. The second etch step preferably proceeds until the self-aligned contact 240 is etched through to the active region 216 in the substrate 210, as shown in FIG. 7.

Figure 8:
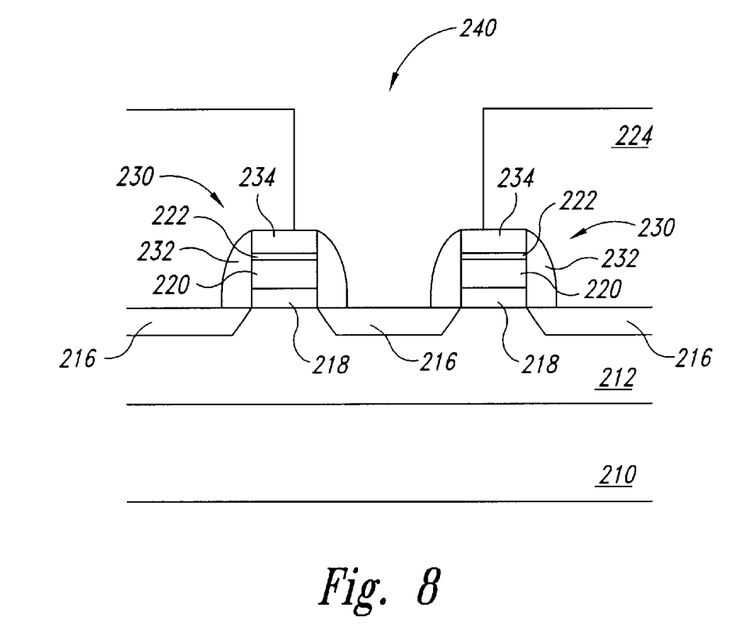
FIG. 8 is a simplified cross-sectional view of the substrate of FIG. 7 at a later point in processing, in accordance with an embodiment of the present invention.

FIG. 8 illustrates the SAC opening with the patterned photoresist layers 222, the ARC 227, and the residual polymer layer 250 removed. The patterned photoresist layers 222, the ARC 227, and the residual polymer layer 250 have been stripped using conventional methods. Such methods will typically include, but are not limited to, wet chemical stripping methods and dry plasma stripping methods.

The invention is further explained with reference to the following examples. The examples are also described with reference to FIGS. 2–8. The following examples are provided merely to assist in describing the present invention by providing specific embodiments. However, the present invention is not intended to be limited by the particular examples described below. Additionally, it will be appreciated that the process parameters described in the present example can be adjusted based on a variety of factors, including device geometry, type of processing tools, and the like. For example, embodiments of the present invention allow for process temperatures below 40 degrees Celsius for capacitively coupled reactors and below 20 degrees Celsius for inductively coupled reactors. The parameters in the present example may also be adjusted or scaled to accommodate wafers of different diameters. For example, the process parameters discussed below are preferably applied to wafers having a diameter of 200 mm. However, it will be appreciated by those of ordinary skill in the art that the present invention can be applied to wafers having smaller or larger diameters. Some of the particular process parameters provided in the example may need to be modified or scaled to apply embodiments of the present invention to wafers of different diameters, however, such modifications are still within the scope of the present invention.

The first etch, which may be carried out in a plasma reactor and a reactive-ion-etching (RIE) or a magnetic-enhanced reactive-ion-etching (MERIE), of the insulating layer 24 is carried out at the following conditions (the gas ratios are approximate ratios):

| | |
|---|---|
| Gases: | $C_4F_8/CH_2F_2/Ar$ 3:1:70 |
| Pressure: | 30–60 mTorr |
| RF Power: | ≦1200 W |
| Magnetic Field: | 0 Gauss–100 Gauss |
| Cathode Temperature: | 10–60 Celsius |
| Gas flows: | $C_4F_8$ >5 sccm |
| | $CH_2F_2$ 5–20 sccm |
| | Ar <500 sccm |

As noted, the first etching step stops when the deposited polymer layer 250 pinches-off the opening between the gate stacks 30.

The second etch may be carried out in the same plasma reactor under the following conditions (the gas ratios are approximate ratios):

| | |
|---|---|
| Gases: | $C_4F_8/CH_2F_2/Ar$ 1:1:50 |
| Pressure: | 30–60 mTorr |
| RF Power: | ≧1500 W |
| Magnetic Field: | 0 Gauss–100 Gauss |
| Cathode Temperature: | 10–60 Celsius |
| Gas flows: | $C_4F_8$ <15 sccm |
| | $CH_2F_2$ 5–20 sccm |
| | Ar >500 sccm |

This second etching step is preferably performed until an opening is made through the deposited polymer layer 250 and the SAC opening 240 is etched to expose the active region 216 in the underlying substrate 210.

The second etching step can be alternatively performed in the same plasma reactor under the following conditions (the gas ratios are approximate ratios):

| | |
|---|---|
| Gases: | $CF_4/CHF_3/CH_2F_2/Ar$ 1:3:1:12 |
| Pressure: | 30–60 mTorr |
| RF Power: | 500–1000 W |
| Magnetic Field: | 0 Gauss–100 Gauss |
| Cathode Temperature: | 10–60 Celsius |
| Gas flows: | $CF_4$ 10–20 sccm |
| | $CHF_3$ 30–60 sccm |
| | $CH_2F_2$ 10–20 sccm |
| | Ar 100–300 sccm |

An alternative embodiment of the present invention includes a first etching step carried out under the following conditions (the gas ratios are approximate ratios):

| | |
|---|---|
| Gases: | $CF_4/CHF_3/CH_2F_2/Ar$ 2:4:1:100 |
| Pressure: | 30–60 mTorr |
| RF Power: | <500 W |
| Magnetic Field: | 0 Gauss–100 Gauss |
| Cathode Temperature: | 10–60 Celsius |
| Gas flows: | $CF_4$ 10–20 sccm |
| | $CHF_3$ >50 sccm |
| | $CH_2F_2$ >20 sccm |
| | Ar <200 sccm |

The conditions for the second SAC etching step can then be as follows (the gas ratios are approximate ratios):

| | |
|---|---|
| Gases: | $CF_4/CHF_3/CH_2F_2/Ar$ 1:3:1:12 |
| Pressure: | 30–60 mTorr |

-continued

| | |
|---|---|
| RF Power: | 500–1000 W |
| Magnetic Field: | 0 Gauss–100 Gauss |
| Cathode Temperature: | 10–60 Celsius |
| Gas flows: | $CF_4$ 10–20 sccm |
| | $CHF_3$ 30–60 sccm |
| | $CH_2F_2$ 10–20 sccm |
| | Ar 100–300 sccm |

The second etch step offers a good oxide-to-nitride selectivity while, at the same time, affords a good selectivity to undoped silicon oxide that form field oxide regions 214.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A method for forming an opening through an interlayer to expose an underlying surface, comprising:
   masking the interlayer to define an etching area at which the opening is formed;
   etching the interlayer under a first etching condition through the etching area;
   forming a protective layer over portions of exposed surfaces of the opening during etching under the first etching condition;
   pinching-off the protective layer to cease etching of the interlayer under the first condition prior to exposing the underlying surface;
   etching the protective layer under a second etching condition to expose a residual interlayer; and
   etching the exposed residual interlayer under the second etching condition to expose the underlying surface.

2. The method of claim 1 wherein forming a protective layer comprises depositing a fluorocarbon polymer layer.

3. The method of claim 1 wherein etching the interlayer under the first and second etching conditions comprise etching the interlayer at a temperature less than or equal to about 40 degrees Celsius.

4. The method of claim 1 wherein etching the interlayer under the first and second etching conditions comprise etching the interlayer at a temperature less than or equal to about 20 degrees Celsius.

5. The method of claim 1 wherein etching the interlayer under the first etching condition comprises etching the interlayer at a power setting less than etching under the second etching condition.

6. The method of claim 1 wherein etching the interlayer under the first etching condition comprises etching the interlayer at a power setting less than or equal to about 500 Watts and employing a plasma chemistry comprising a $CF_4/CHF_3/CH_2F_2/Ar$ gas mixture and etching the protective layer and the exposed residual interlayer under the second etching condition comprises etching at a power setting between about 500 Watts and 1,000 Watts and employing a plasma chemistry comprising a $CF_4/CHF_3/CH_2F_2/Ar$ gas mixture.

7. The method of claim 1 wherein etching the interlayer under the first etching condition comprises etching the interlayer at a power setting at less than or equal to about 1,200 Watts and employing a plasma chemistry comprising a $C_4F_8/CH_2F_2/Ar$ gas mixture.

8. The method of claim 1 wherein etching the interlayer under the second etching condition comprises etching the protective layer and the exposed residual interlayer at a power setting of greater than or equal to approximately 1,500 Watts and employing a plasma chemistry comprising a $C_4F_8/CH_2F_2/Ar$ gas mixture.

9. The method of claim 8 wherein etching the interlayer under the second etching condition comprises etching the protective layer and the exposed residual interlayer at a power setting between approximately 500 Watts and 1,000 Watts and employing a plasma chemistry comprising a $CF_4/CHF_3/CH_2F_2/Ar$ gas mixture.

10. The method of claim 1 wherein etching the interlayer under the first etching condition employs a plasma chemistry comprising a fluorocarbon chemistry.

11. The method of claim 10 wherein etching the interlayer under the second etching condition employs a plasma chemistry comprising a fluorocarbon chemistry.

12. The method of claim 1 wherein etching the interlayer under the first etching condition employs a plasma chemistry comprising a $C_4F_8/CH_2F_2/Ar$ gas mixture.

13. The method of claim 12 wherein etching the interlayer under the second etching condition employs a plasma chemistry comprising a $C_4F_8/CH_2F_2/Ar$ gas mixture.

14. The method of claim 12 wherein etching the interlayer under the second etching condition employs a plasma chemistry comprising a $CF_4/CHF_3/CH_2F_2/Ar$ gas mixture.

15. The method of claim 1 wherein etching the interlayer under the first etching condition employs a plasma chemistry comprising a $CF_4/CHF_3/CH_2F_2/Ar$ gas mixture.

16. The method of claim 15 wherein etching the interlayer under the second etching condition employs a plasma chemistry comprising a $C_xF_y$ (x>1)-type chemistry.

17. The method of claim 1 wherein etching the interlayer under the first etching condition employs a plasma chemistry comprising $C_xH_yF_z$ (x>0)-type chemistry.

18. The method of claim 1 wherein etching the interlayer under the second etching condition employs a plasma chemistry comprising $C_xH_yF_z$ (x>0)-type chemistry.

19. A method for etching an opening through a dielectric material to expose a surface region located between first and second underlying structures, the method comprising:
   defining an etching region over the surface region;
   performing a first etching process to concurrently remove dielectric material and form a protective layer on portions of exposed regions of the opening;
   forming the protective layer between the first and second underlying structures to cover a residual layer of dielectric material on the surface region; and
   performing a second etching process to remove a portion of the protective layer and remove the residual layer of dielectric material to expose the surface region.

20. The method of claim 19 wherein forming a protective layer comprises performing an over-polymerizing etch promoting deposition of a fluorocarbon polymer layer.

21. The method of claim 19 wherein performing the first and second etching processes comprise etching the dielectric material at a temperature less than or equal to about 40 degrees Celsius.

22. The method of claim 19 wherein performing the first and second etching processes comprise etching the dielectric material at a temperature less than or equal to about 40 degrees Celsius.

23. The method of claim 19 wherein performing the first etching process comprises etching the dielectric material at a power setting less than at which the second etching process is performed.

24. The method of claim 19 wherein performing the first etching process comprises etching the dielectric material at a power setting less than or equal to about 500 Watts and employing a plasma chemistry comprising a $CF_4/CHF_3/CH_2F_2/Ar$ gas mixture and performing the second etching process comprises etching the protective layer and the residual layer of dielectric material at a power setting between about 500 Watts and 1,000 Watts and employing a plasma chemistry comprising a $CF_4/CHF_3/CH_2F_2/Ar$ gas mixture.

25. The method of claim 19 wherein performing the first etching process comprises etching the dielectric material at a power setting at less than or equal to about 1,200 Watts and employing a plasma chemistry comprising a $C_4F_8/CH_2F_2/Ar$ gas mixture.

26. The method of claim 25 wherein performing the second etching process comprises etching the protective layer and residual layer of dielectric material at a power setting of greater than or equal to approximately 1,500 Watts and employing a plasma chemistry comprising a $C_4F_8/CH_2F_2/Ar$ gas mixture.

27. The method of claim 25 wherein performing the second etching process comprises etching the protective layer and residual layer of dielectric material at a power setting between about 500 Watts and 1,000 Watts and employing a plasma chemistry comprising a $CF_4/CHF_3/CH_2F_2/Ar$ gas mixture.

28. The method of claim 19 wherein performing the first etching process employs a plasma chemistry comprising a fluorocarbon chemistry.

29. The method of claim 28 wherein performing the second etching process employs a plasma chemistry comprising a fluorocarbon chemistry.

30. The method of claim 19 wherein performing the first etching process employs a plasma chemistry comprising a $C_4F_8/CH_2F_2/Ar$ gas mixture.

31. The method of claim 30 wherein performing the second etching process employs a plasma chemistry comprising a $C_4F_8/CH_2F_2/Ar$ gas mixture.

32. The method of claim 30 wherein performing the second etching process employs a plasma chemistry comprising a $CF_4/CHF_3/CH_2F_2/Ar$ gas mixture.

33. The method of claim 19 wherein performing the first etching process employs a plasma chemistry comprising a $CF_4/CHF_3/CH_2F_2/Ar$ gas mixture.

34. The method of claim 33 wherein performing the second etching process employs a plasma chemistry comprising a $C_xF_y$ (x>1)-type chemistry.

35. The method of claim 19 wherein performing the first etching process employs a plasma chemistry comprising $C_xH_yF_z$ (x>0)-type chemistry.

36. The method of claim 19 wherein performing the second etching process employs a plasma chemistry comprising $C_xH_yF_z$ (x>0)-type chemistry.

37. The method of claim 19 wherein the first and second underlying structures comprise first and second gate structures having silicon nitride caps and spacers.

38. The method of claim 19 wherein the first and second underlying structures comprise first and second gate structures having silicon oxide caps and spacers.

39. A method for forming a self-aligned contact through an interlayer, comprising:
   patterning a mask layer to define an etching area at which a contact opening is formed;
   etching the interlayer through the etching area under a first etching condition, the first etching condition being an over-polymerizing condition promoting the formation of a fluorocarbon polymer layer on exposed surfaces of the contact opening;
   pinching-off the fluorocarbon polymer layer to create an etch stop condition that inhibits etching of the interlayer under the first etching condition; and
   etching the pinched-off fluorocarbon polymer layer and the interlayer under a second etching condition to complete the contact opening.

40. The method of claim 39 wherein etching the interlayer under the first etching condition comprises etching the interlayer at a power setting less than etching under the second etching condition.

41. The method of claim 39 wherein etching the interlayer under the first and second etching conditions comprise etching the interlayer at a temperature less than or equal to about 40 degrees Celsius.

42. The method of claim 39 wherein etching the interlayer under the first and second etching conditions comprise etching the interlayer at a temperature less than or equal to about 20 degrees Celsius.

43. The method of claim 39 wherein etching the interlayer under the first etching condition comprises etching the interlayer at a power setting less than about 500 Watts and employing a plasma chemistry comprising a $CF_4/CHF_3/CH_2F_2/Ar$ gas mixture and etching the pinched-off fluorocarbon polymer layer and the interlayer under the second etching condition comprises etching at a power setting between about 500 Watts and 1,000 Watts and employing a plasma chemistry comprising a $CF_4/CHF_3/CH_2F_2/Ar$ gas mixture.

44. The method of claim 39 wherein etching the interlayer under the first etching condition comprises etching the interlayer at a power setting at less than or equal to about 1,200 Watts and employing a plasma chemistry comprising a $C_4F_8/CH_2F_2/Ar$ gas mixture.

45. The method of claim 44 wherein etching the pinched-off fluorocarbon layer and the interlayer under the second etching condition comprises etching at a power setting of greater than or equal to approximately 1,500 Watts and employing a plasma chemistry comprising a $C_4F_8/CH_2F_2/Ar$ gas mixture.

46. The method of claim 44 wherein etching the pinched-off fluorocarbon layer and the interlayer under the second etching condition comprises etching at a power setting of between 500 and 1,000 Watts and employing a plasma chemistry comprising a $CF_4/CHF_3/CH_2F_2/Ar$ gas mixture.

47. The method of claim 39 wherein etching the interlayer under the first etching condition employs a plasma chemistry comprising a fluorocarbon chemistry.

48. The method of claim 47 wherein etching the interlayer under the second etching condition employs a plasma chemistry comprising a fluorocarbon chemistry.

49. The method of claim 39 wherein etching the interlayer under the first etching condition employs a plasma chemistry comprising a $C_4F_8/CH_2F_2/Ar$ gas mixture.

50. The method of claim 49 wherein etching the pinched-off fluorocarbon layer and the interlayer under the second etching condition employs a plasma chemistry comprising a $C_4F_8/CH_2F_2/Ar$ gas mixture.

51. The method of claim 49 wherein etching the pinched-off fluorocarbon layer and the interlayer under the second etching condition employs a plasma chemistry comprising a $CF_4/CHF_3/CH_2F_2/Ar$ gas mixture.

52. The method of claim 39 wherein etching the interlayer under the first etching condition employs a plasma chemistry comprising a $CF_4/CHF_3/CH_2F_2/Ar$ gas mixture.

53. The method of claim 52 wherein etching the pinched-off fluorocarbon layer and the interlayer under the second etching condition employs a plasma chemistry comprising a $C_xF_y$ (x>1)-type chemistry.

54. The method of claim 39 wherein etching the interlayer under first etching condition employs a plasma chemistry comprising $C_xH_yF_z$ (x>0)-type chemistry.

55. The method of claim 39 wherein etching the interlayer under the second etching condition employs a plasma chemistry comprising $C_xH_yF_z$ (x>0)-type chemistry.

56. A method for forming a self-aligned contact through a dielectric interlayer to a surface region between first and second gate structures, the method comprising:
    masking the dielectric interlayer to define an etching area at which the self-aligned contact is formed;
    etching the dielectric interlayer through the etching area to expose portions of the first and second gate structures, the etching performed under a first etching condition promoting the deposition of a fluorocarbon polymer layer on the exposed portions of the first and second gate structures;
    depositing the fluorocarbon polymer layer until the fluorocarbon polymer layer pinches-off in the region of the exposed portions of the first and second gate structures; and
    etching the fluorocarbon polymer layer in the pinched-off region and any residual dielectric interlayer between the first and second gate structures to expose the surface region, the etching performed under a second etching condition having a power setting greater than the first etching condition.

57. The method of claim 56 wherein etching the dielectric interlayer under the first etching condition comprises etching the interlayer at a power setting less than etching under the second etching condition.

58. The method of claim 56 wherein etching the interlayer under the first and second etching conditions comprise etching the interlayer at a temperature less than or equal to about 40 degrees Celsius.

59. The method of claim 56 wherein etching the interlayer under the first and second etching conditions comprise etching the interlayer at a temperature less than or equal to about 20 degrees Celsius.

60. The method of claim 56 wherein etching the dielectric interlayer under the first etching condition comprises etching the interlayer at a power setting less than about 500 Watts and employing a plasma chemistry comprising a $CF_4/CHF_3/CH_2F_2/Ar$ gas mixture and etching the fluorocarbon polymer layer in the pinched-off region and any residual dielectric interlayer between the first and second gate structures under the second etching condition comprises etching at a power setting between about 500 Watts and 1,000 Watts and employing a plasma chemistry comprising a $CF_4/CHF_3/CH_2F_2/Ar$ gas mixture.

61. The method of claim 56 wherein etching the interlayer under the first etching condition comprises etching the interlayer at a power setting less than or equal to about 1,200 Watts and employing a plasma chemistry comprising a $C_4F_8/CH_2F_2/Ar$ gas mixture.

62. The method of claim 61 wherein etching the interlayer under the second etching condition comprises etching the fluorocarbon polymer layer and the residual dielectric interlayer at a power setting of greater than or equal to approximately 1,500 Watts and employing a plasma chemistry comprising a $C_4F_8/CH_2F_2/Ar$ gas mixture.

63. The method of claim 61 wherein etching the interlayer under the second etching condition comprises etching the fluorocarbon polymer layer and the residual dielectric interlayer at a power setting of between approximately 500 Watts and 1,000 Watts and employing a plasma chemistry comprising a $CF_4/CHF_3/CH_2F_2/Ar$ gas mixture.

64. The method of claim 56 wherein etching the interlayer under the first etching condition employs a plasma chemistry comprising a fluorocarbon chemistry.

65. The method of claim 64 wherein etching the interlayer under the second etching condition employs a plasma chemistry comprising a fluorocarbon chemistry.

66. The method of claim 56 wherein etching the interlayer under the first etching condition employs a plasma chemistry comprising a $C_4F_8/CH_2F_2/Ar$ gas mixture.

67. The method of claim 66 wherein etching the fluorocarbon polymer layer and the residual dielectric interlayer under the second etching condition employs a plasma chemistry comprising a $C_4F_8/CH_2F_2/Ar$ gas mixture.

68. The method of claim 66 wherein etching the fluorocarbon polymer layer and the residual dielectric interlayer under the second etching condition employs a plasma chemistry comprising a $CF_4/CHF_3/CH_2F_2/Ar$ gas mixture.

69. The method of claim 56 wherein etching the interlayer under the first etching condition employs a plasma chemistry comprising a $CF_4/CHF_3/CH_2F_2/Ar$ gas mixture.

70. The method of claim 69 wherein etching the fluorocarbon polymer layer and the residual dielectric interlayer under the second etching condition employs a plasma chemistry comprising a $C_xF_y$ (x>1)-type chemistry.

71. The method of claim 56 wherein etching the interlayer under first etching condition employs a plasma chemistry comprising $C_xH_yF_z$ (x>0)-type chemistry.

72. The method of claim 56 wherein etching the interlayer under the second etching condition employs a plasma chemistry comprising $C_xH_yF_z$ (x>0)-type chemistry.

73. The method of claim 56 wherein the first and second gate structures include silicon nitride caps and spacers.

74. The method of claim 56 wherein the first and second gate structures include silicon oxide caps and spacers.

75. A method for exposing a surface region on which a dielectric material is formed, comprising:
    defining an area on the dielectric material at which to form an opening exposing the surface region;
    under a first etching condition, partially etching through the dielectric material to leave a portion of dielectric material covering the surface region;
    depositing a fluorocarbon polymer layer over exposed surfaces of the opening and covering the portion of dielectric material; and
    under a second etching condition, etching through the fluorocarbon polymer layer and etching the portion of dielectric material covering the surface to expose the surface region.

76. The method of claim 75 wherein depositing a fluorocarbon polymer layer comprises performing an over-polymerizing etch promoting deposition of a fluorocarbon polymer layer.

77. The method of claim 75 wherein etching under the first and second etching conditions comprise etching the interlayer at a temperature less than or equal to about 40 degrees Celsius.

78. The method of claim 75 wherein etching under the first and second etching conditions comprise etching the interlayer at a temperature less than or equal to about 20 degrees Celsius.

79. The method of claim 75 wherein partially etching through the dielectric material under the first etching condition comprises etching at a power setting less than etching under the second etching condition.

80. The method of claim 75 wherein partially etching through the dielectric material under the first etching condition comprises etching the dielectric material at a power setting of less than 500 Watts and employing a plasma chemistry comprising a $CF_4/CHF_3/CH_2F_2/Ar$ gas mixture and etching the fluorocarbon polymer layer and the portion of dielectric material comprises etching at a power setting between about 500 Watts and 1,000 Watts and employing a plasma chemistry comprising a $CF_4/CHF_3/CH_2F_2/Ar$ gas mixture.

81. The method of claim 75 wherein partially etching through the dielectric material under the first etching condition comprises etching at a power setting at less than about 1,200 Watts and employing a plasma chemistry comprising a $C_4F_8/CH_2F_2/Ar$ gas mixture.

82. The method of claim 81 wherein the fluorocarbon polymer layer and the portion of dielectric material under the second etching condition comprises etching at a power setting of greater than approximately 1,500 Watts and employing a plasma chemistry comprising a $C_4F_8/CH_2F_2/Ar$ gas mixture.

83. The method of claim 81 wherein the fluorocarbon polymer layer and the portion of dielectric material under the second etching condition comprises etching at a power setting of between about 500 Watts and 1,000 Watts and employing a plasma chemistry comprising a $CF_4/CHF_3/CH_2F_2/Ar$ gas mixture.

84. The method of claim 75 wherein partially etching through the dielectric material under the first etching condition employs a plasma chemistry comprising a fluorocarbon chemistry.

85. The method of claim 84 wherein etching through the fluorocarbon polymer layer and the residual dielectric material under the second etching condition employs a plasma chemistry comprising a fluorocarbon chemistry.

86. The method of claim 75 wherein partially etching through the dielectric material under the first etching condition employs a plasma chemistry comprising a $C_4F_8/CH_2F_2/Ar$ gas mixture.

87. The method of claim 86 wherein etching the fluorocarbon polymer layer and the portion of dielectric material under the second etching condition employs a plasma chemistry comprising a $C_4F_8/CH_2F_2/Ar$ gas mixture.

88. The method of claim 86 wherein etching the fluorocarbon polymer layer and the portion of dielectric material under the second etching condition employs a plasma chemistry comprising a $CF_4/CHF_3/CH_2F_2/Ar$ gas mixture.

89. The method of claim 75 wherein partially etching through the dielectric material under the first etching condition employs a plasma chemistry comprising a $CF_4/CHF_3/CH_2F_2/Ar$ gas mixture.

90. The method of claim 89 wherein etching the fluorocarbon polymer layer and the portion of dielectric material under the second etching condition employs a plasma chemistry comprising a $C_xF_y$ (x>1)-type chemistry.

91. The method of claim 75 wherein partially etching through the dielectric interlayer under first etching condition employs a plasma chemistry comprising $C_xH_yF_z$ (x>0)-type chemistry.

92. The method of claim 75 wherein etching through the fluorocarbon polymer layer and etching the portion of the dielectric material under the second etching condition employs a plasma chemistry comprising $C_xH_yF_z$ (x>0)-type chemistry.

* * * * *

UNITED STATES PATENT AND TRADEMARK OFFICE
CERTIFICATE OF CORRECTION

PATENT NO. : 6,716,766 B2
DATED : April 6, 2004
INVENTOR(S) : Kei-Yu Ko

It is certified that error appears in the above-identified patent and that said Letters Patent is hereby corrected as shown below:

Column 5,
Line 29, reads "to well-know semiconductor" should read -- to well-known semiconductor --

Column 8,
Line 3, "Gas flows: $C_4F_8$ > 5 sccm" should read
-- Gas flows: $C_4F_8$ > 15 sccm --

Signed and Sealed this

Twenty-eighth Day of December, 2004

JON W. DUDAS
*Director of the United States Patent and Trademark Office*